(12) United States Patent
Liu et al.

(10) Patent No.: US 7,329,591 B2
(45) Date of Patent: Feb. 12, 2008

(54) METHOD FOR FORMING SILICON-CONTAINING FILM AND METHOD FOR DECREASING NUMBER OF PARTICLES

(75) Inventors: Che-Hung Liu, Yongkang (TW); Po-Lun Cheng, Fongshan (TW); Hwei-Lin Chuang, Pitou Township, Changhua County (TW); Chun-An Lin, Kengzaiping (TW)

(73) Assignee: United Microelectronics Corp., Hsinchu (TW)

( * ) Notice: Subject to any disclaimer, the term of this patent is extended or adjusted under 35 U.S.C. 154(b) by 180 days.

(21) Appl. No.: 11/358,971

(22) Filed: Feb. 21, 2006

(65) Prior Publication Data

US 2007/0197007 A1 Aug. 23, 2007

(51) Int. Cl.
*C23C 16/24* (2006.01)

(52) U.S. Cl. ............... 438/488; 438/778; 257/E21.263; 257/E21.292

(58) Field of Classification Search ................ 438/488, 438/778; 257/E21.263, E21.292
See application file for complete search history.

(56) References Cited

U.S. PATENT DOCUMENTS

2005/0118834 A1* 6/2005 Toshikawa et al. ......... 438/778

* cited by examiner

*Primary Examiner*—Kiesha L. Rose
*Assistant Examiner*—Eric W Jones
(74) *Attorney, Agent, or Firm*—J.C. Patents

(57) ABSTRACT

A method for forming a silicon-containing film is described. A substrate is placed in a reaction chamber, and then a silicon-containing gas is introduced into the reaction chamber to conduct a CVD process and deposit a silicon-containing film on the substrate. During the CVD process, the temperature of at least the top inner surface of the reaction chamber is controlled below 50° C.

15 Claims, 1 Drawing Sheet

METHOD FOR FORMING SILICON-CONTAINING FILM AND METHOD FOR DECREASING NUMBER OF PARTICLES

BACKGROUND OF THE INVENTION

1. Field of the Invention

The present invention relates to a method for forming a thin film. More particularly, the present invention relates to a method for forming a silicon-containing film and to a method for decreasing the number of particles.

2. Description of the Related Art

Chemical vapor deposition (CVD) is a technology that deposits on a substrate a solid reaction product formed from the reaction of one or more gaseous reactants, and has recently become a major film deposition tool for many conductor, semiconductor and dielectric materials. In semiconductor processes, for example, silicon-containing gases are used frequently for many conductor, semiconductor and dielectric materials contain silicon, wherein silane ($SiH_4$) is used most widely.

However, since a CVD process using $SiH_4$ needs higher temperature and forms a Si-containing film of lower uniformity, $SiH_4$ is not so suitable for deep sub-micron processes that require lower thermal budget and higher uniformity. Hence, in current CVD processes, $SiH_4$ is gradually replaced by disilane or trisilane that decomposes at a lower temperature and is capable of improving the uniformity of the deposited film.

However, since disilane or trisilane decomposes at a lower temperature, it easily causes gas-phase nucleation to form particles. The particles not only contaminate the substrate surface to form defects in the deposited film, but also adhere to the inner surfaces of the reaction chamber to be a contamination source in subsequent uses. The particle problem becomes even more significant in nano-scale fabricating processes.

SUMMARY OF THE INVENTION

Accordingly, this invention provides a method for forming a silicon-containing film that can inhibit the gas-phase nucleation based on the silicon-containing gas in the reaction chamber to improve the quality of the deposited film.

This invention also provides a method for reducing a number of particles, which is applied to a process of forming a silicon-containing film for inhibiting the gas-phase nucleation based on the silicon-containing gas, thereby improving the quality of the deposited film and the cleanness of the reaction chamber.

The method for forming a silicon-containing film of this invention is described as follows. A substrate is placed in a reaction chamber, and then a silicon-containing gas is introduced to conduct a CVD process and deposit a silicon-containing film on the substrate, wherein the temperature of the top inner surface of the reaction chamber is controlled below 50° C.

The method for decreasing a number of particles of this invention is applied to a CVD process that introduces a silicon-containing gas into a reaction chamber to form a silicon-containing film. The method includes controlling the temperature of the top inner surface of the reaction chamber below 50° C. during the CVD process.

In the above methods, the silicon-containing gas may include di- or tri-silane. The temperature of other inner surface of the reaction chamber may also be controlled below 50° C. like the top inner surface is. The method of controlling the temperature of the top inner surface of the reaction chamber below 50° C. may include controlling the temperature of a cooling system for cooling the top inner surface below 50° C.

In addition, the above silicon-containing film may be a silicon oxide (SiO) film, a silicon nitride (SiN) film, a silicon oxynitride (SiON) film, a silicon carbonitride (SiCN) film, a polysilicon (poly-Si) film or a silicon-containing metal film. During the CVD process, at least one of $NH_3$ gas, $O_2$ gas and a fluorine-containing gas may also be introduced into the reaction chamber as a reaction gas to form a silicon compound film. In the CVD process, the substrate may be heated by a heater disposed under it and the temperature of the heater may be set about 600-750° C. The CVD process may be an atmospheric-pressure CVD (APCVD) process, a low-pressure CVD (LPCVD) process, a plasma-enhanced CVD (PECVD) process or a high-density plasma CVD (HDP-CVD) process.

For the temperature of the top inner surface of the reaction chamber is controlled below 50° C. in the above methods, less energy is provided to the silicon-containing gas molecules near the top inner surface so that the gas-phase nucleation rate is lowered and the particle number is decreased correspondingly. Thus, the particle-defect number in the deposited silicon-containing film is decreased and the cleanness of the reaction chamber improved. Accordingly, when a Si-containing gas liable to decomposition like disilane or trisilane is used, not only the uniformity of the deposited Si-containing film is improved, but also the particle-defect number in the silicon-containing film is decreased and the cleanness of the reaction chamber improved.

It is to be understood that both the foregoing general description and the following detailed description are exemplary, and are intended to provide further explanation of the invention as claimed.

DESCRIPTION OF THE PREFERRED EMBODIMENTS

Figure 1:
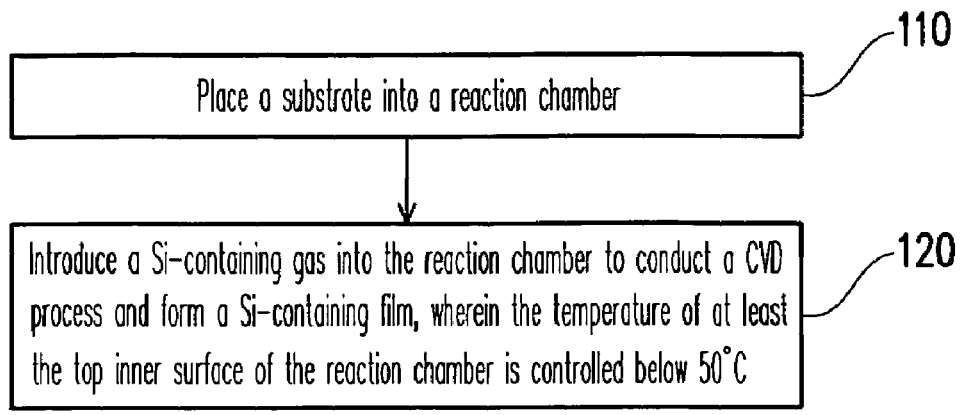
FIG. 1 illustrates a process flow of forming a silicon-containing film according to an embodiment of this invention.
Figure 2:
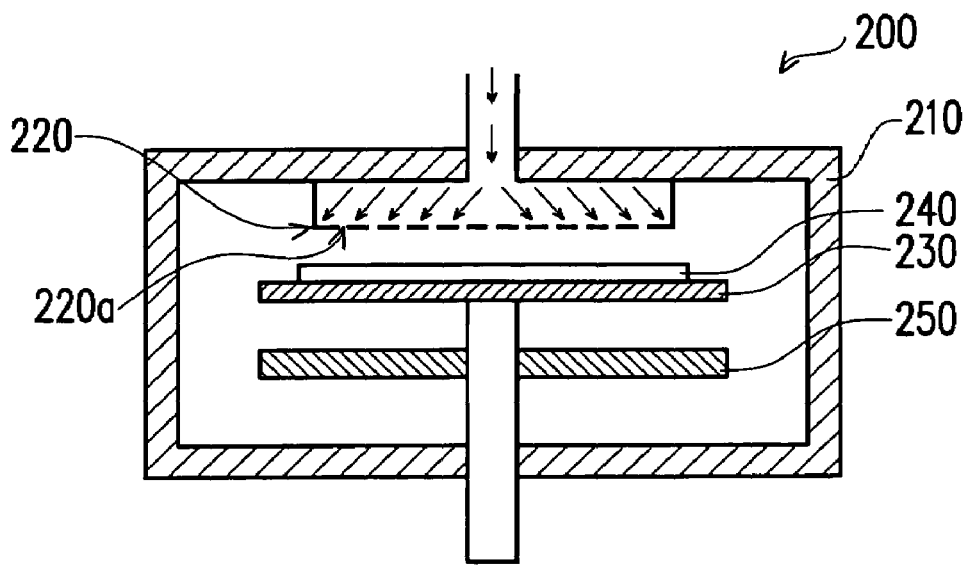
FIG. 2 illustrates an example of a reaction chamber suitably used in the method for forming a silicon-containing film of this invention.

Referring to FIGS. 1-2, the reaction chamber 200 may include a cooling system 210, a gas shower head 220, a base 230 under the gas shower head 220 and a heater 250 under the base 230. The cooling system 210 may be disposed at the upper side of the reaction chamber 200 only or around the whole reaction chamber 200, with cooling water or other cooling fluid therein. The gas shower head 220 may include a faceplate with many gas holes 220a therein. The reaction chamber 200 surely can be disposed with other elements known in the art to improve the deposition quality. It is also noted that though the reaction chamber 220 shown in FIG. 2 is a single-wafer-type chamber, this invention can be readily applied to a batch-type chamber.

Referring to FIGS. 1-2 again, a substrate 240 to be processed is placed in the reaction chamber 200 in step 110, wherein the substrate 240 may be placed on the base 230. The substrate 240 may be a silicon-substrate, a semiconductor-on-insulator (SOI). substrate, a ceramic material, glass, a plastic material like polycarbonate (PC) or polystyrene (PS), silicon carbide, a single-crystal material, quartz, diamond-like carbon, gallium arsenide (GaAs) or a metal oxide material. The substrate 240 may have been formed with one or more films or devices (not shown) thereon.

In next step 120, a silicon-containing gas is conducted into the reaction chamber 200 to conduct a CVD process and deposit a silicon-containing film. During the CVD process, the cooling system 210 is operated such that the temperature of the top inner surface (and other inner surface) of the reaction chamber 200 is controlled below 50° C., preferably below 30° C. The silicon-containing gas is distributed onto the surface of the substrate 240 through the gas shower head 220, and the heater 250 is turned on to heat the substrate 240 to a temperature capable of inducing the reaction of the silicon-containing gas. The cooling medium in the cooling system 210 may be water or any other suitable fluid. When the cooling system 210 is disposed around the whole reaction chamber 200, the top, side and bottom inner surfaces of the reaction chamber 200 can be controlled by controlling the temperature of the cooling system 210.

In addition, the CVD process may be an APCVD process, an LPCVD process, a PECVD process or an HDP-CVD process, but is not restricted to them. The type of the CVD process can be suitably selected according to the material to be deposited. The silicon-containing gas introduced into the reaction chamber 200 may be disilane or trisilane, which decomposes at a lower temperature so that the thermal budget of the process is lowered.

The deposited Si-containing film may be a SiO film like a film of borosilicate glass (BSG), phosphosilicate glass (PSG), borophosphosilicate glass (BPSG) or fluorosilicate glass (FSG), a SiN film, a SiON film, a SiCN film, a polysilicon film or a Si-containing metallic film like a tungsten silicide film. Accordingly, to form a film of a silicon compound, at least one of $O_2$ gas, $NH_3$ gas and a fluorine-containing gas can be introduced as a reaction gas to react with the silicon-containing gas.

The temperature of the substrate 240 may be set at 600-750° C. by the heater 250 according to the material to be deposited. For example, a SiN film can be deposited using disilane and $NH_3$ as reaction gases. Though disilane decomposes at a lower temperature, decomposition of $NH_3$ requires a high temperature so that the temperature of the substrate 240 has to be controlled as high as 700° C. In the prior art, the cooling system 210 is set at about 70° C. making the temperature at the gas shower head 220 be about 200° C., so that gas-phase nucleation occurs before the disilane molecules pass the gas shower head 220 to cause particle contamination. In this invention, however, the cooling system 210 is set such that the temperature of at least the top inner surface of the reaction chamber 200 is below 50° C., so that the gas-phase nucleation rate is lowered reducing the particle defects and improving the cleanness of the reaction chamber.

As mentioned above, the method for forming a Si-containing film of the above embodiment may use a decomposition-liable Si-containing gas like disilane or trisilane as a silicon source to form a Si-containing film of better uniformity. One feature of the method is to lower the temperature of the inner surface of the reaction chamber and thereby lower the temperature above the gas shower head, so as to reduce the energy provided to the Si-containing gas molecules near the inner surface and thus decrease the gas-phase nucleation rate. Hence, less particles are formed contaminating the wafer surface or the reaction chamber, so that the process yield is increased, the maintenance frequency of the reaction chamber is reduced and the process cost is lowered.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for forming a silicon-containing film, comprising:
   placing a substrate in a reaction chamber; and
   introducing a silicon-containing gas to conduct a chemical vapor deposition (CVD) process and deposit a silicon-containing film on the substrate, wherein a temperature of at least a top inner surface of the reaction chamber is controlled below 50° C.

2. The method of claim 1, wherein the silicon-containing gas comprises disilane or trisilane.

3. The method of claim 1, further comprising controlling a temperature of other inner surface of the reaction chamber below 50° C.

4. The method of claim 1, wherein controlling the temperature of the top inner surface of the reaction chamber below 50° C. comprises: controlling a temperature of a cooling system for cooling the top inner surface below 50° C.

5. The method of claim 1, wherein the silicon-containing film comprises a SiO film, a SiN film, a SiON film, a SiCN film, a polysilicon film or a silicon-containing metal film.

6. The method of claim 1, wherein during the CVD process, at least one of $NH_3$ gas, $O_2$ gas and a fluorine-containing gas is also introduced into the reaction chamber as a reaction gas.

7. The method of claim 1, wherein the substrate is heated by a heater that is set at about 600-750° C.

8. The method of claim 1, wherein the CVD process comprises an APCVD process, an LPCVD process, a PECVD process or an HDP-CVD process.

9. A method for decreasing a number of particles, applied to a CVD process that introduces a silicon-containing gas into a reaction chamber to form a silicon-containing film, and comprising:
   controlling a temperature of a top inner surface of the reaction chamber below 50° C. during the CVD process.

10. The method of claim 9, wherein the silicon-containing gas comprises disilane or trisilane.

11. The method of claim 9, further comprising controlling a temperature of other inner surface of the reaction chamber below 50° C.

12. The method of claim 9, wherein controlling the temperature of the top inner surface of the reaction chamber below 50° C. comprises: controlling a temperature of a cooling system for cooling the top inner surface below 50° C.

13. The method of claim 9, wherein the silicon-containing film comprises a SiO film, a SiN film, a SiON film, a SiCN film, a polysilicon film or a silicon-containing metal film.

14. The method of claim 9, wherein during the CVD process, at least one of $NH_3$ gas, $O_2$ gas and a fluorine-containing gas is also introduced into the reaction chamber as a reaction gas.

15. The method of claim 9, wherein the CVD process comprises an APCVD process, an LPCVD process, a PECVD process or an HDP-CVD process.

* * * * *